(12) United States Patent
Tsai et al.

(10) Patent No.: US 10,762,618 B1
(45) Date of Patent: Sep. 1, 2020

(54) MASK WEAK PATTERN RECOGNITION APPARATUS AND MASK WEAK PATTERN RECOGNITION METHOD

(71) Applicant: UNITED MICROELECTRONICS CORP., Hsinchu (TW)

(72) Inventors: Pin-Yen Tsai, Hsinchu (TW); Hsu-Tang Liu, Hsinchu (TW); Yi-Jung Chang, Hsinchu (TW); Chun-Liang Hou, Hsinchu (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 63 days.

(21) Appl. No.: 16/275,480

(22) Filed: Feb. 14, 2019

(51) Int. Cl.
*G06K 9/00* (2006.01)
*G06T 7/00* (2017.01)

(52) U.S. Cl.
CPC .. *G06T 7/0004* (2013.01); *G06T 2207/20081* (2013.01); *G06T 2207/30148* (2013.01)

(58) Field of Classification Search
None
See application file for complete search history.

(56) References Cited

U.S. PATENT DOCUMENTS

| | | | | |
|---|---|---|---|---|
| 5,115,475 A * | 5/1992 | Lebeau | G06T 7/001 | |
| | | | 257/E21.525 | |
| 6,401,227 B1 * | 6/2002 | Yasue | G01R 31/318328 | |
| | | | 714/731 | |
| 6,507,800 B1 * | 1/2003 | Sheu | H01L 22/20 | |
| | | | 257/E21.525 | |
| 7,108,946 B1 * | 9/2006 | Lukanc | G03F 7/70633 | |
| | | | 430/22 | |
| 7,583,832 B2 * | 9/2009 | Okuda | G06T 7/001 | |
| | | | 348/125 | |
| 7,600,212 B2 * | 10/2009 | Zach | G03F 1/36 | |
| | | | 716/50 | |
| 7,958,463 B2 * | 6/2011 | Ikeuchi | G06F 30/398 | |
| | | | 716/54 | |
| 8,071,943 B2 * | 12/2011 | Murakawa | G03F 1/86 | |
| | | | 250/306 | |

(Continued)

FOREIGN PATENT DOCUMENTS

DE 10360536 A1 * 5/2005 .......... G01M 11/081

OTHER PUBLICATIONS

Overlay measurement: a hidden error, Christopher J Gould et al., SPIE, 10.1117/12.386496. Jun. 2, 2000, pp. 400-415 (Year: 2000).*

(Continued)

*Primary Examiner* — Jayesh A Patel
(74) *Attorney, Agent, or Firm* — WPAT, PC

(57) ABSTRACT

A mask weak pattern recognition apparatus and a mask weak pattern recognition method are provided. The mask weak pattern recognition apparatus includes a receiving unit, an overlapping unit, an analyzing unit and a training unit. The receiving unit is used for receiving a mask layout and an inspection image of a mask. The overlapping unit is used for overlapping the mask layout and the inspection image to obtain an overlapped image. The analyzing unit is used for obtaining a plurality of risk patterns and a plurality of risk scores each of which corresponds one of the risk patterns according to the overlapped image. The training unit is used for training a recognition model according to the risk patterns and the risk scores.

22 Claims, 7 Drawing Sheets

(56) References Cited

U.S. PATENT DOCUMENTS

| | | | | |
|---|---|---|---|---|
| 8,434,030 B1* | 4/2013 | Hou | G06F 30/398 | 716/52 |
| 8,463,016 B2* | 6/2013 | Pang | G03F 1/84 | 382/141 |
| 8,464,194 B1* | 6/2013 | Agarwal | G03F 7/70433 | 716/112 |
| 9,607,233 B2* | 3/2017 | Kaizerman | G06K 9/033 | |
| 9,626,459 B2* | 4/2017 | Agarwal | G06K 9/6269 | |
| 9,690,898 B2* | 6/2017 | Graur | G06F 30/398 | |
| 10,043,264 B2* | 8/2018 | Greenberg | G06K 9/033 | |
| 2001/0053242 A1* | 12/2001 | Okada | G06T 7/0004 | 382/145 |
| 2003/0152260 A1* | 8/2003 | Cai | G06T 7/001 | 382/141 |
| 2004/0122636 A1* | 6/2004 | Adam | G03F 7/70941 | 703/2 |
| 2004/0156540 A1* | 8/2004 | Gao | G06T 7/0004 | 382/145 |
| 2005/0002560 A1* | 1/2005 | Yamamoto | G06T 7/0004 | 382/156 |
| 2005/0142455 A1* | 6/2005 | Ando | G06T 7/001 | 430/5 |
| 2008/0016481 A1* | 1/2008 | Matsuoka | G06F 30/398 | 716/52 |
| 2009/0292387 A1* | 11/2009 | Funakoshi | G06F 3/0481 | 700/110 |
| 2010/0092876 A1* | 4/2010 | Kanamitsu | G03F 1/84 | 430/5 |
| 2011/0119642 A1* | 5/2011 | Agarwal | G03F 7/705 | 716/50 |
| 2011/0188734 A1* | 8/2011 | Tsuchiya | G06T 7/0002 | 382/149 |
| 2012/0040280 A1* | 2/2012 | Agarwal | G03F 7/70433 | 430/30 |
| 2013/0031518 A1* | 1/2013 | Robles | G06F 30/398 | 716/52 |
| 2014/0045334 A1* | 2/2014 | Choi | H01L 21/027 | 438/694 |
| 2014/0358830 A1* | 12/2014 | Chiang | G06K 9/4642 | 706/12 |
| 2016/0005157 A1* | 1/2016 | Toyoda | H01J 37/222 | 382/149 |
| 2016/0267648 A1* | 9/2016 | Yamashita | G01N 21/95607 | |
| 2017/0148689 A1* | 5/2017 | Park | G06K 9/00536 | |
| 2017/0186144 A1* | 6/2017 | Chien | G06T 5/002 | |
| 2018/0204315 A1* | 7/2018 | Plihal | G06K 9/20 | |
| 2018/0232873 A1* | 8/2018 | Inoue | G01N 21/95607 | |
| 2019/0066286 A1* | 2/2019 | Shiratsuchi | G06T 5/002 | |
| 2019/0066290 A1* | 2/2019 | Shaubi | G06K 9/6269 | |
| 2019/0073566 A1* | 3/2019 | Brauer | G06K 9/6262 | |
| 2019/0096053 A1* | 3/2019 | Asbag | G06K 9/00127 | |
| 2019/0130552 A1* | 5/2019 | Sohn | G03F 1/36 | |
| 2019/0155267 A1* | 5/2019 | Shin | G05B 23/0221 | |
| 2019/0188840 A1* | 6/2019 | Kwon | G06T 7/0004 | |
| 2019/0228516 A1* | 7/2019 | Umeda | G06T 7/001 | |
| 2019/0244513 A1* | 8/2019 | Niculescu-Mizil | G06T 3/403 | |
| 2019/0333208 A1* | 10/2019 | Asbag | G06K 9/6256 | |
| 2019/0370955 A1* | 12/2019 | Zhang | G06N 3/0472 | |
| 2020/0020092 A1* | 1/2020 | Fang | G06K 9/6267 | |
| 2020/0118261 A1* | 4/2020 | Watanabe | G03F 1/38 | |
| 2020/0124979 A1* | 4/2020 | Jung | G03F 1/36 | |

OTHER PUBLICATIONS

Combinatin of rule and pattern based lithography—flow., Kang, Jae-Hyun et al., SPIE, 10.1117/12.801312, 2008, pp. 1-9 (Year: 2008).*

* cited by examiner

MASK WEAK PATTERN RECOGNITION APPARATUS AND MASK WEAK PATTERN RECOGNITION METHOD

TECHNICAL FIELD

The disclosure relates in general to a recognition apparatus and a recognition method, and more particularly to a mask weak pattern recognition apparatus and a mask weak pattern recognition method.

BACKGROUND

Along with the pitch shrinking in the semiconductor manufacturing, the effects of optical diffraction are becoming more and more serious. The changes of the mask layout may result in unpredictable risks. The risks of mask layout are critical in semiconductor manufacturing. In conventional, a mask layout draft is needed to be piloted run for obtaining the risk pattern and then the risk pattern is modified accordingly. However, the cost of the pilot run is quite high. Therefore, how to develop a method that can predict the risk without actual experiment is one of the important research and development directions.

SUMMARY

The disclosure is directed to a mask weak pattern recognition apparatus and a mask weak pattern recognition method. The mask weak pattern recognition apparatus is used for generating a recognition model by machine learning and predicting a risk score prediction of a mask layout draft via the recognition model without actual experiments.

According to one embodiment, a mask weak pattern recognition apparatus is provided. The mask weak pattern recognition apparatus includes a receiving unit, an overlapping unit, an analyzing unit and a training unit. The receiving unit is used for receiving a mask layout and an inspection image of a mask. The overlapping unit is used for overlapping the mask layout and the inspection image to obtain an overlapped image. The analyzing unit is used for obtaining a plurality of risk patterns and a plurality of risk scores each of which corresponds one of the risk patterns according to the overlapped image. The training unit is used for training a recognition model according to the risk patterns and the risk scores.

According to another embodiment, a mask weak pattern recognition method is provided. The mask weak pattern recognition method includes the following steps. A mask layout of a mask and an inspection image are received. The mask layout and the inspection image are overlapped to obtain an overlapped image. A plurality of risk patterns and a plurality of risk scores each of which corresponds one of the risk patterns are obtained according to the overlapped image. A recognition model is trained according to the risk patterns and the risk scores.

Figure 1:
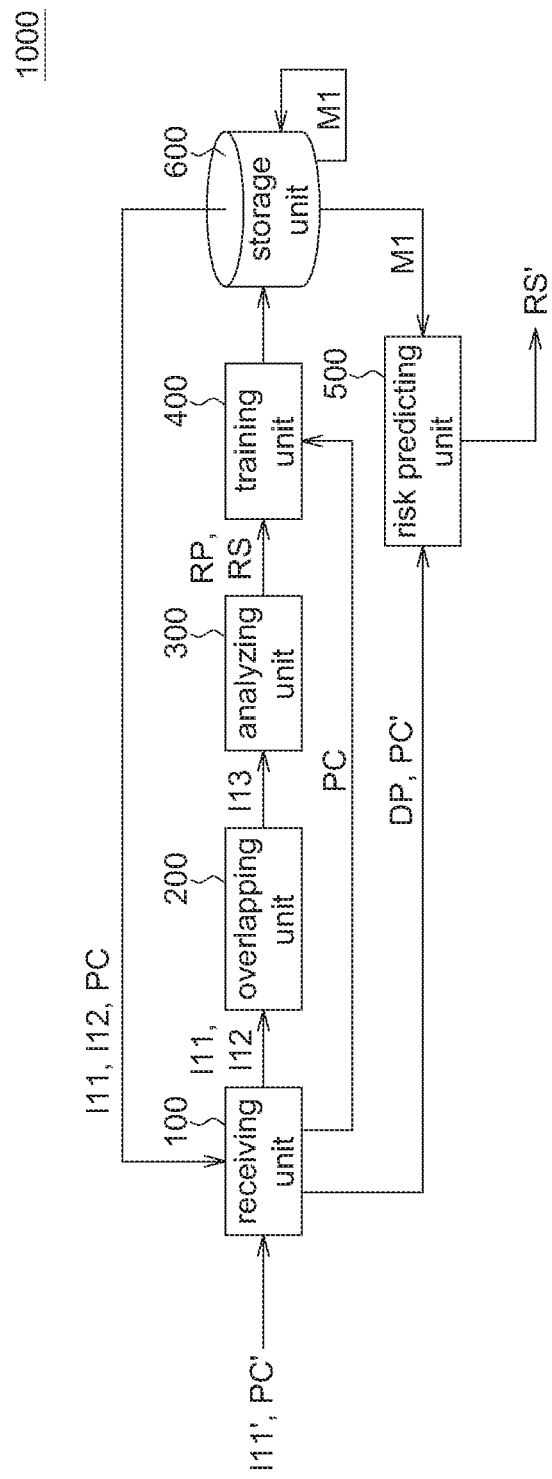
FIG. 1 shows a mask weak pattern recognition apparatus according to one embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Please referring FIG. 1, a mask weak pattern recognition apparatus 1000 according to one embodiment is shown. The mask weak pattern recognition apparatus 1000 is used for generating a recognition model M1 by machine learning and predicting a risk score prediction RS' of a mask layout draft I11' via the recognition model M1 without actual experiments.

The mask weak pattern recognition apparatus 1000 may include a receiving unit 100, an overlapping unit 200, an analyzing unit 300, a training unit 400, a risk predicting unit 500 and a storage unit 600. The receiving unit 100 is used for receiving data. For example, the receiving unit 100 may be a transmission cable, a wireless transmission module or a memory reader. Each of the overlapping unit 200, the analyzing unit 300, the training unit 400 and the risk predicting unit 500 may be a chip, a circuit, a firmware, a computer, a computing cluster or a storage device storing a plurality of program codes. The storage unit 600 may be a memory, a disk or a storage cloud. The operation of those elements is illustrated with a flowchart.

Figure 2:
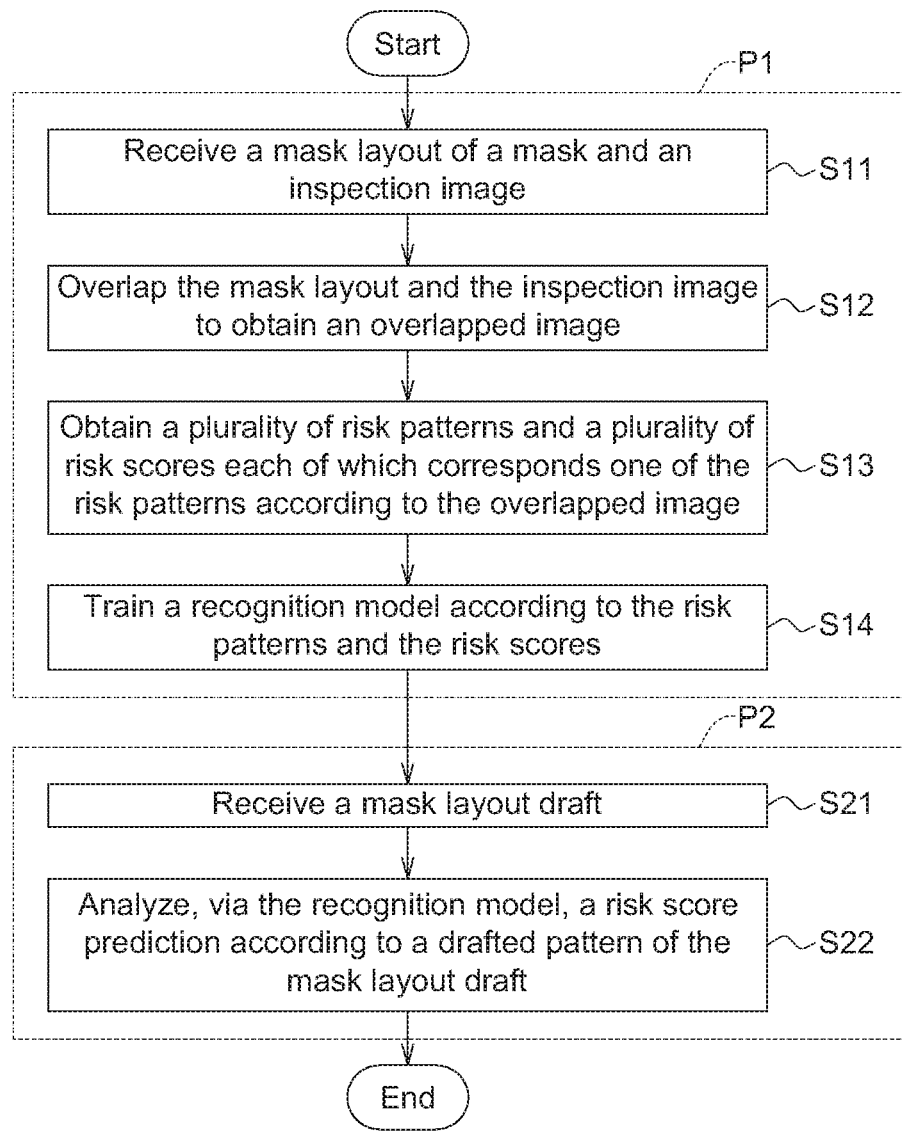
FIG. 2 shows a flowchart of a mask weak pattern recognition method according to one embodiment.

Please refer to FIG. 2, which shows a flowchart of a mask weak pattern recognition method according to one embodiment. The mask weak pattern recognition method includes an off-line procedure P1 and an on-line procedure P2. The off-line procedure P1 is used for training the recognition model M1, and the on-line procedure P2 is used for predicting the risk score prediction RS' via the recognition model M1.

Figure 3:
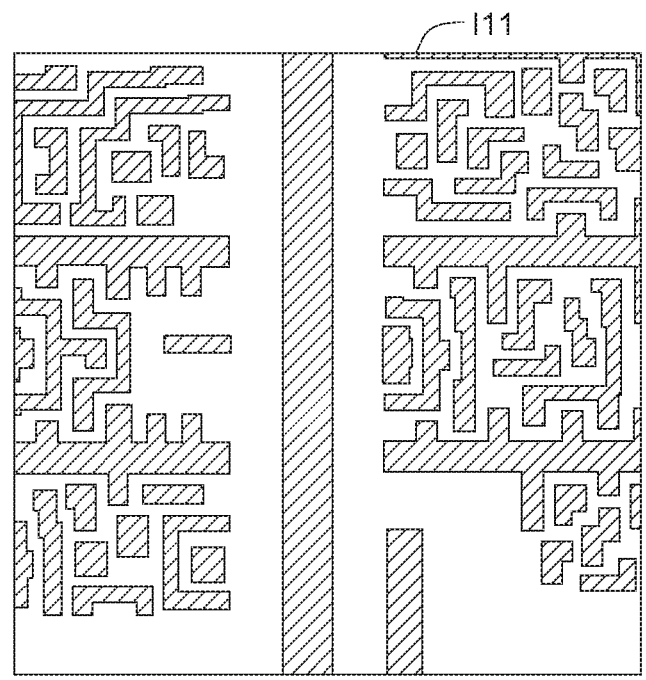
FIG. 3 shows a mask layout according to one embodiment.
Figure 4:
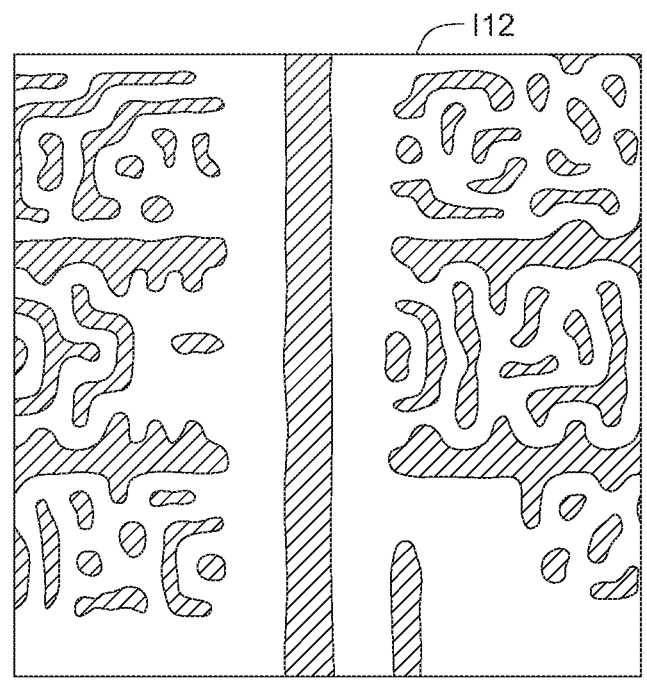
FIG. 4 shows an inspection image according to one embodiment.

The off-line procedure P1 includes steps S11 to S14. In the step S11, the receiving unit 100 receives a mask layout I11 and an inspection image I12 of a mask and a process condition PC. The process condition PC may be the settings of the equipment or the material. In one embodiment, the process condition PC may not be received in this step. Please refer to FIG. 3, which shows the mask layout I11 according to one embodiment. The mask layout I11 shows a layout which is printed on a mask. During the exposure and development procedure, the mask having the mask layout I11 is disposed in front of a wafer which is coated a photoresist layer. The photoresist layer is exposed by a light or a beam passing through the mask. Then, the pattern of the photoresist layer is developed via chemical solvent. Next, the wafer is etched. Please referring to FIG. 4, which shows the inspection image I12 according to one embodiment. In one embodiment, the inspection image I12 may be a scanning electron microscope image (SEM image) of the photoresist layer after exposure and development. Or, the inspection image I12 may be a SEM image of a wafer after etching. That is to say, the inspection image I12 is the result corresponding the mask layout I11. Due to the optical diffraction of the light (or the beam), the inspection image I12 may not be identical to the mask layout I11. Therefore, the inspection image I12 may have open risk or short risk.

Figure 5:
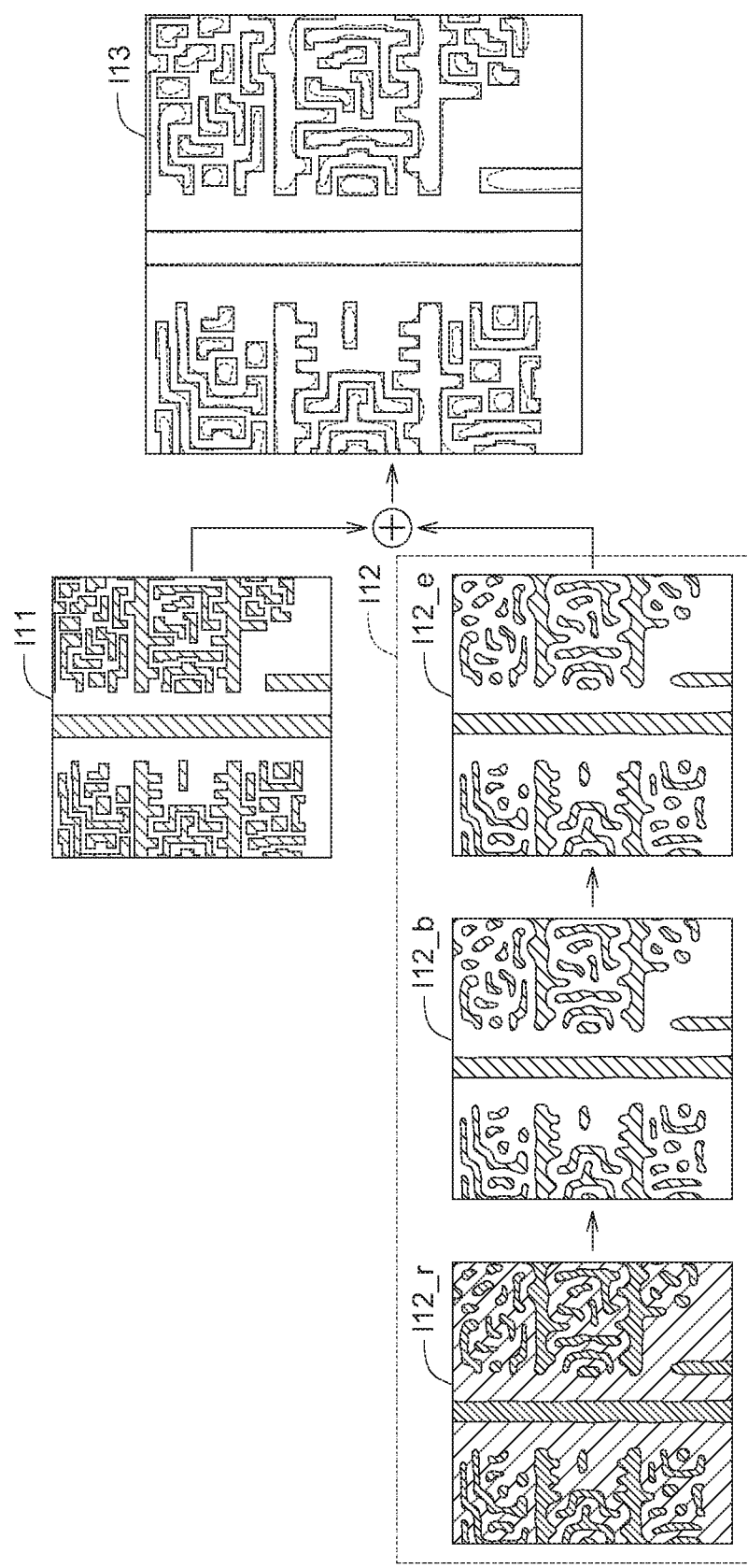
FIG. 5 shows an overlapped image according to one embodiment.

Next, refer to FIG. 5, which shows an overlapped image I13 according to one embodiment. In the step S12, the overlapping unit 200 overlaps the mask layout I11 and the inspection image I12 to obtain the overlapped image I13. In this step, the overlapping unit 200 may perform a Binaryzation procedure on a raw image I12_r of the inspection image I12 to obtain a binary image I12_b of the inspection image I12, such that the shape becomes clear. Then, the overlapping unit 200 may perform an enhance procedure on the binary image I12_b to obtain an enhanced image I12_e, such that the noise is filtered. The overlapping unit 200 overlaps the mask layout I11 and the inspection image I12 and to obtain the overlapped image I13. In the overlapped image I13, the mask layout I11 is shown by solid lines and the inspection image I12 is shown by dotted lines. As shown in the overlapped image I13, the inspection image I12 is not identical to the mask layout I11.

Figure 6:
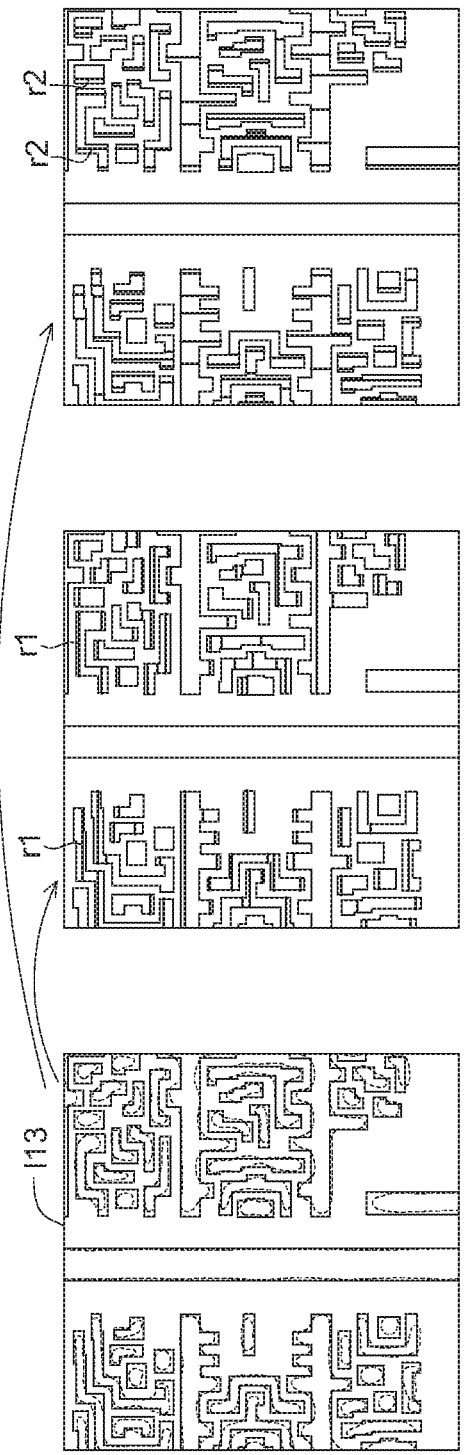
FIG. 6 highlights candidate risk segments and candidate risk segments according to one embodiment.
Figure 7:
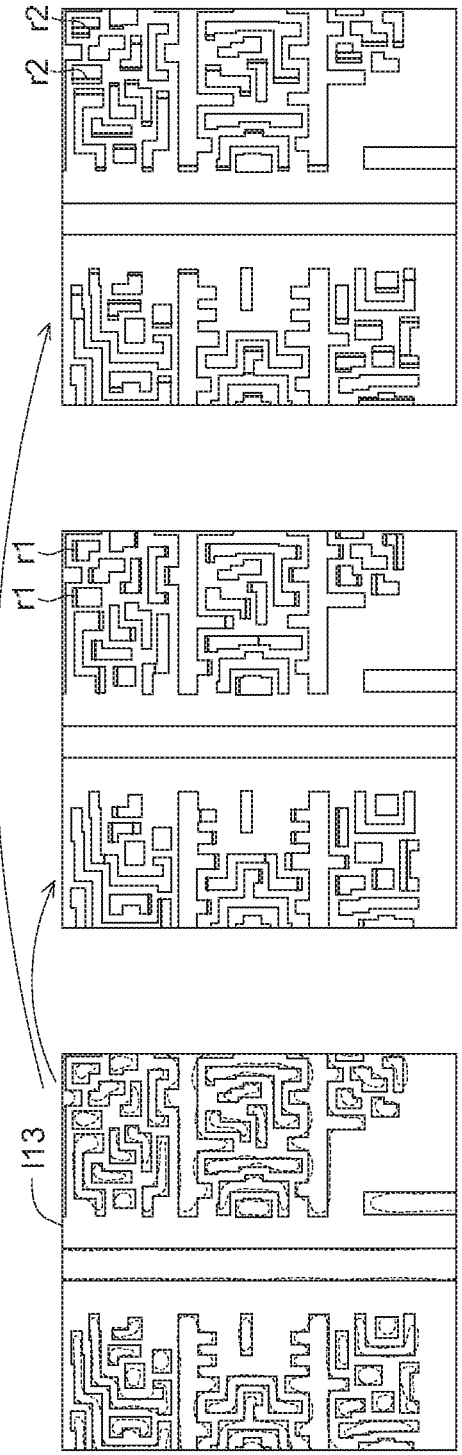
FIG. 7 highlights candidate risk segments and candidate risk segments according to another embodiment.

Afterwards, in the step S13, the analyzing unit 300 obtains a plurality of risk patterns RP and a plurality of risk scores RS each of which corresponds one of the risk patterns RP according to the overlapped image I13. In this step, the analyzing unit 300 may compare the mask layout I11 and the inspection image I12 along a horizontal direction and a vertical direction. Refer to FIG. 6 which highlights candidate risk segments r1 and candidate risk segments r2 according to one embodiment. In the example of FIG. 6, each of the candidate risk segments r1 is a line segment whose difference ratio along the horizontal direction is larger than 10%, and each of the candidate risk segments r2 is a line segment whose difference ratio along the vertical direction is larger than 10%. Refer to FIG. 7 which highlights candidate risk segments r1 and candidate risk segments r2 according to another embodiment. In the example of FIG. 7, each of the candidate risk segments r1 is a line segment whose difference ratio along the horizontal direction is larger than 40%, and each of the candidate risk segments r2 is a line segment whose difference ratio along the vertical direction is larger than 40%.

Figure 8:
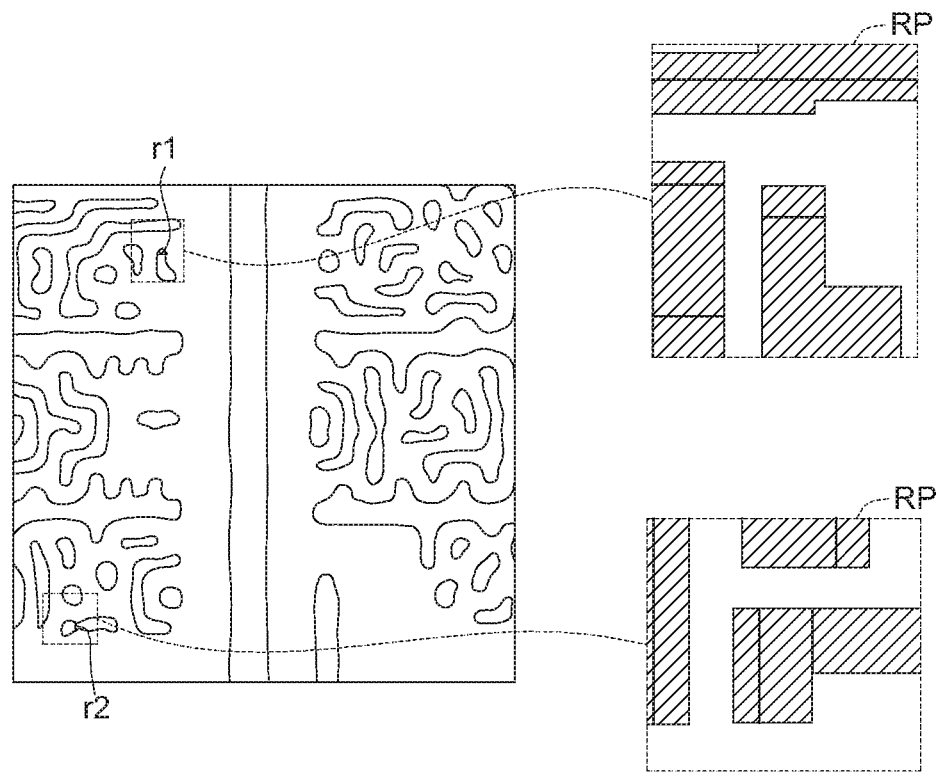
FIG. 8 shows two risk patterns according to one embodiment.

The candidate risk segments r1, r2 may be the short diameters or the long diameters of a trace. Refer to FIG. 8, which shows two risk patterns RP according to one embodiment. The open risk is easily happened on the short diameter of the trace. So, the analyzing unit 300 measures the length of the candidate risk segments r1, r2 which are the short diameters of the trace, and judges the risk scores RS according to the lengths of the candidate risk segments r1, r2 which are the short diameters of the trace. In one example, the smaller the length is, the higher the risk score RS is. That is to say, the risk score RS can highlight the open risk. In the two risk patterns RP of FIG. 8, the candidate risk segments r1, r2 which are the short diameters of the trace are very short, so the corresponding risk scores RS are very high.

Figure 9:
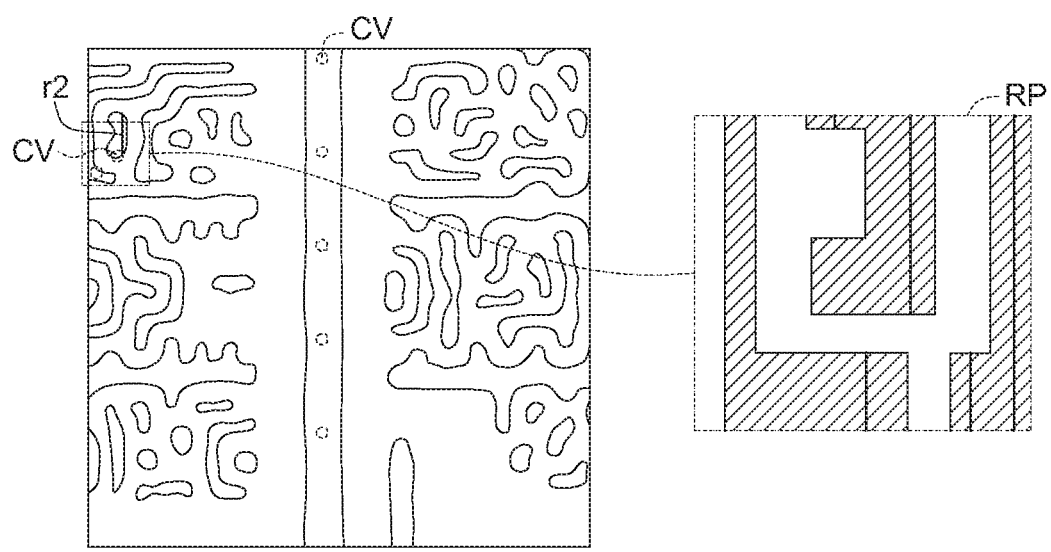
FIG. 9 shows a risk pattern according to one embodiment.

Refer to FIG. 9, which shows a risk pattern RP according to one embodiment. The trace may connect to contact via holes CV. The contact via holes CV are usually located at long diameters of the trace. The open risk or the short risk is easily happened at the contact via holes CV whose offset ratios are large. The analyzing unit 300 finds the contact via holes CV located on the candidate risk segments r1, r2 which are the long diameters of the trace and judges the risk scores RS according to the offset ratios of the contact via holes CV. In one example, the higher the offset ratio is, the higher the risk score RS is. That is to say, the risk score RS can highlight the open risk or the short risk. In the risk pattern RP of FIG. 9, the offset ratio of this contact via hole CV located at the candidate risk segment r2 which is the long diameter of the trace is very high, so the corresponding risk score RS is very high.

After finding out all of the risk patterns RP, the coordinates of the risk patterns RP, the risk scores RS and the process conditions PC are recorded. Referring to table I, which shows the risk patterns RP, the risk scores RS and the process conditions PC according to one embodiment.

TABLE I

| Risk patterns RP | Risk scores RS | Coordinates | Process conditions PC | ... |
|---|---|---|---|---|
| #1 | 5 | (5, 3) | 1 | ... |
| #2 | 7 | (6, 5) | −1 | ... |
| #3 | 2 | (4, 7) | 2 | ... |
| ... | ... | ... | ... | ... |

Figure 10:
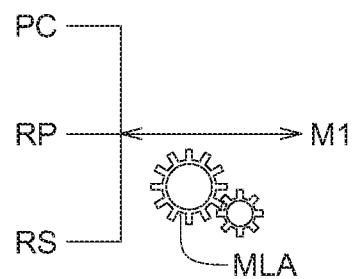
FIG. 10 illustrates the step S14 according to one embodiment.

Next, in the step S14, the training unit 400 trains the recognition model M1 according to the risk patterns RP, the risk scores RS and the process conditions PC. In one embodiment, the process conditions PC may not be used in this step. Refer to FIG. 10, which illustrates the step S14 according to one embodiment. In this step, the training unit 400 trains the recognition model M1 via a machine learning algorithm MLA, such as ResNet algorithm, AlexNet algorithm, or VGG algorithm.

Base on above, the off-line procedure P1 including steps S11 to S14 is performed to obtain the recognition model M1. The off-line procedure P1 can be repeated performed for modifying the recognition model M1.

Afterwards, the process proceeds to the on-line procedure P2 including steps S21 to S22. In the step S21, the receiving unit 100 receives a mask layout draft I11' of a mask and a process condition plan PC'.

Figure 11:
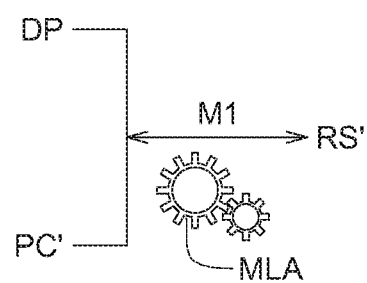
FIG. 11 illustrates the step S22 according to one embodiment.

Next, in the step S22, the risk predicting unit 500 analyzes, via the recognition model M1, a risk score prediction RS' according to a drafted pattern DP of the mask layout draft I11' and the process condition plan PC'. In one embodiment, the process condition plan PC' may not be used in the on-line procedure P2. Refer to FIG. 11, which illustrates the step S22 according to one embodiment. The risk score prediction RS' is used for determining whether the drafted pattern DP has risk. If the risk score prediction RS' is high, the drafted pattern DP must be modified and the step S21 and S22 are repeated performed until the risk score prediction RS' is low enough.

Base on the embodiments described above, the mask weak pattern recognition apparatus 1000 can be used for generating the recognition model M1 by machine learning and predicting the risk score prediction RS' of the mask layout draft I11' of the mask via the recognition model M1 without actual experiments. Thus, the drafted pattern DP of the mask layout draft I11' can be modified without excessive cost.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A mask weak pattern recognition apparatus, comprising:
   a receiving unit used for receiving a mask layout and an inspection image of a mask;
   an overlapping unit used for overlapping the mask layout and the inspection image to obtain an overlapped image;
   an analyzing unit used for obtaining a plurality of risk patterns and a plurality of risk scores each of which corresponds one of the risk patterns according to the overlapped image; and
   a training unit used for training a recognition model according to the risk patterns and the risk scores.

2. The mask weak pattern recognition apparatus according to claim 1, wherein the inspection image is an image of a photoresist layer after exposure and development.

3. The mask weak pattern recognition apparatus according to claim 1, wherein the inspection image is an image of a wafer after etching.

4. The mask weak pattern recognition apparatus according to claim 1, wherein the analyzing unit compares the mask layout and the inspection image along a horizontal direction and a vertical direction.

5. The mask weak pattern recognition apparatus according to claim 1, wherein the analyzing unit obtains each of the risk scores according to a difference between the mask layout and the inspection image in a horizontal direction.

6. The mask weak pattern recognition apparatus according to claim 1, wherein the analyzing unit obtains each of the risk scores according to a difference between the mask layout and the inspection image in a vertical direction.

7. The mask weak pattern recognition apparatus according to claim 1, wherein the analyzing unit obtains each of the risk scores according to a length of a short diameter of a trace.

8. The mask weak pattern recognition apparatus according to claim 1, wherein the analyzing unit obtains each of the risk scores according to a contact via hole at a long diameter of a trace.

9. The mask weak pattern recognition apparatus according to claim 1, wherein the training unit trains the recognition model according to a process condition.

10. The mask weak pattern recognition apparatus according to claim 1, wherein the receiving unit is further used for receiving a mask layout draft, and the mask weak pattern recognition apparatus further comprises:
    a risk predicting unit for predicting, via the recognition model, a risk score prediction according to a drafted pattern of the mask layout draft, wherein the risk score prediction is used for determining whether the drafted pattern has risk.

11. The mask weak pattern recognition apparatus according to claim 10, wherein the receiving unit is further used for receiving a process condition plan, and the risk predicting unit obtains, via the recognition model, the risk score prediction according to the drafted pattern and the process condition plan.

12. A mask weak pattern recognition method, comprising:
    receiving a mask layout of a mask and an inspection image of the mask;
    overlapping the mask layout and the inspection image to obtain an overlapped image;
    obtaining a plurality of risk patterns and a plurality of risk scores each of which corresponds one of the risk patterns according to the overlapped image; and
    training a recognition model according to the risk patterns and the risk scores.

13. The mask weak pattern recognition method according to claim 12, wherein in the step of receiving the mask layout and the inspection image of the mask, the inspection image is an image of a photoresist layer after exposure and development.

14. The mask weak pattern recognition method according to claim 12, wherein in the step of receiving the mask layout and the inspection image of the mask, the inspection image is an image of a wafer after etching.

15. The mask weak pattern recognition method according to claim 12, wherein in the step of obtaining the risk patterns and the risk scores, the mask layout and the inspection image are compared along a horizontal direction and a vertical direction.

16. The mask weak pattern recognition method according to claim 12, wherein in the step of obtaining the risk patterns and the risk scores, each of the risk scores is obtained according to a difference between the mask layout and the inspection image in a horizontal direction.

17. The mask weak pattern recognition method according to claim 12, wherein in the step of obtaining the risk patterns and the corresponding risk scores, each of the risk scores is obtained according to a difference between the mask layout and the inspection image in a vertical direction.

18. The mask weak pattern recognition method according to claim 12, wherein in the step of obtaining the risk patterns and the corresponding risk scores, each of the risk scores is obtained according to a length of a short diameter of a trace.

19. The mask weak pattern recognition method according to claim 12, wherein in the step of obtaining the risk patterns and the corresponding risk scores, each of the risk scores is obtained according to a contact via hole at a long diameter of a trace.

20. The mask weak pattern recognition method according to claim 12, wherein in the step of training the recognition model according to the risk patterns and the corresponding risk scores, the recognition model is also trained according to a process condition.

21. The mask weak pattern recognition method according to claim 12, further comprising:
    receiving a mask layout draft; and
    analyzing, via the recognition model, a risk score prediction according to a drafted pattern of the mask layout draft, wherein the risk score prediction is used for determining whether the drafted pattern has risk.

22. The mask weak pattern recognition method according to claim 21, wherein a process condition plan is also received and the risk score prediction is obtained, via the recognition model, according to the drafted pattern and the process condition plan.

* * * * *